United States Patent
Wang

(10) Patent No.: US 9,891,832 B2
(45) Date of Patent: Feb. 13, 2018

(54) MEMORY SAVING SYSTEM AND METHODS FOR BUFFER OVERFLOW THAT OCCURS DURING IMAGE COMPRESSION

(71) Applicant: KYOCERA Document Solutions Inc., Osaka (JP)

(72) Inventor: Hui Wang, Temple City, CA (US)

(73) Assignee: KYOCERA Document Solutions Inc. (JP)

(*) Notice: Subject to any disclaimer, the term of this patent is extended or adjusted under 35 U.S.C. 154(b) by 148 days.

(21) Appl. No.: 14/981,027

(22) Filed: Dec. 28, 2015

(65) Prior Publication Data

US 2017/0185307 A1  Jun. 29, 2017

(51) Int. Cl.

| | |
|---|---|
| *G06K 9/60* | (2006.01) |
| *G06F 3/06* | (2006.01) |
| *G06F 12/02* | (2006.01) |
| *H04N 19/426* | (2014.01) |
| *H04N 19/48* | (2014.01) |
| *H04N 19/90* | (2014.01) |

(52) U.S. Cl.
CPC .......... *G06F 3/0605* (2013.01); *G06F 3/0608* (2013.01); *G06F 3/0631* (2013.01); *G06F 3/0656* (2013.01); *G06F 3/0661* (2013.01); *G06F 3/0673* (2013.01); *G06F 12/023* (2013.01); *H04N 19/426* (2014.11); *H04N 19/48* (2014.11); *H04N 19/90* (2014.11); *G06F 2212/1016* (2013.01); *G06F 2212/1044* (2013.01); *G06F 2212/172* (2013.01); *G06F 2212/401* (2013.01)

(58) Field of Classification Search
USPC ....... 382/232, 243, 235, 305, 233, 248, 240; 1/1; 341/51, 87, 67, 107; 2/172; 375/E7.076, E7.093; 386/235, 239, 263
See application file for complete search history.

(56) References Cited

U.S. PATENT DOCUMENTS

| | | | | |
|---|---|---|---|---|
| 5,708,431 | A | * 1/1998 | Howard | H03M 7/4006 341/107 |
| 5,737,481 | A | * 4/1998 | Gushima | G11B 19/042 386/235 |
| 5,850,504 | A | 12/1998 | Cooper et al. | |
| 5,991,515 | A | 11/1999 | Fall et al. | |
| 6,567,559 | B1 | 5/2003 | Easwar | |

(Continued)

*Primary Examiner* — Anh H Do
(74) *Attorney, Agent, or Firm* — McDonnell Boehnen Hulbert & Berghoff LLP

(57) ABSTRACT

The present disclosure is directed to memory saving systems and methods for buffer overflow that occurs during image compression. In example embodiments, when an overflow occurs during image compression, the overflow data is written to an allocated designated overflow memory by an overflow handler. This memory can be designed to be rewritten multiple times during the image compression process, and can therefore occupy less memory than would be required in possible alternative solutions that comprise expanding the size of each unit of compression destination memory to account for the worst case compression scenario in each instance. Various embodiments that utilize the designated overflow memory to conserve memory when buffer overflow occurs during image compression are illustrated and described.

20 Claims, 10 Drawing Sheets

(56) References Cited

U.S. PATENT DOCUMENTS 6,574,368 B1 * 6/2003 Boon ............... H04N 21/23655
                                                375/E7.076
6,789,266 B1 * 9/2004 Mills ..................... A42B 1/045
                                                       2/172

* cited by examiner

MEMORY SAVING SYSTEM AND METHODS FOR BUFFER OVERFLOW THAT OCCURS DURING IMAGE COMPRESSION

BACKGROUND

Unless otherwise indicated herein, the materials described in this section are not prior art to the claims in this application and are not admitted to be prior art by inclusion in this section.

In recent years, various types of printing devices have become popular for both business and consumer use. In addition to traditional black and white printers, color printers, scanners, copiers, fax machines, and other components are now common. Multi-function peripherals (MFPs), that support two or more of these operations, are also widely available. As these devices have grown more prevalent, they are being used for processing of more sophisticated and complicated documents.

Such sophisticated and complicated documents can take up a significant amount of memory within a computing device or a printing device. This leads to a lack of storage space within these devices, in addition to an increased time required for transmitting such documents. Therefore, it can be desirable to compress the documents that are being stored and transmitted.

During the compression process, additional memory storage problems may arise, particularly in printing devices with small amounts of on-board system memory.

SUMMARY

The present application discloses embodiments that relate to memory saving systems and methods for buffer overflow that occurs during image compression. By reducing the amount of memory allocated as a buffer space, the total memory used for image compression is decreased. This decrease in total memory may yield improvements in printing speed and printing device cost (less on-board memory is required).

In one aspect, the present application describes an image forming system configured to conserve memory during image compression when an overflow occurs. The system includes a compression destination memory configured to store image data that results from image compression, wherein the compression destination memory occupies an amount of memory congruent with an amount of memory originally contained within a target region in an image to be compressed. Additionally, the system includes a designated overflow memory configured to store data that results from an overflow during image compression, wherein the designated overflow memory occupies an amount of memory congruent with an amount of memory that would be necessary in the case of a maximum amount of overflow of the compression destination memory occurring during the image compression. Further, the system includes a compression handler, wherein the compression handler is a set of instructions that is executable by a processing unit and stored on a non-transitory, computer readable medium, configured to write, to the compression destination memory, compressed data of the target region in the image to be compressed. Also, the system includes an overflow handler, wherein the overflow handler is a set of instructions that is executable by a processing unit when overflow occurs during compression, wherein the overflow handler is stored on a non-transitory, computer readable medium, and further wherein the overflow handler is configured to write overflow data to the designated overflow memory.

In a different aspect, the present application describes a method for conserving memory when an overflow occurs during image compression. The method includes allocating a compression destination memory configured to store image data that results from the image compression and occupies an amount of memory congruent with an amount of memory contained within a target region in an image to be compressed. In addition, the method includes allocating a designated overflow memory configured to store data that results from an overflow memory during image compression, wherein the designated overflow memory occupies an amount of memory congruent with an amount of memory that would be necessary in the case of a maximum amount of overflow of the compression destination memory occurring during image compression. Still further, the method includes registering the memory location of the compression destination memory with a compression handler and the memory location of the designated overflow memory with an overflow handler, wherein the compression handler and the overflow handler are sets of instructions that are configured to be executed by a processing unit and are stored within a non-transitory, computer-readable medium, wherein the compression handler is configured to write, to the compression destination memory, compressed data of the target region in the image to be compressed and the overflow handler is configured to write overflow data to the designated overflow memory.

In a third aspect, the present application describes a method for compressing images that conserves memory when an overflow occurs. The method includes sensing an overflow has occurred during compression, by a compression handler stored on a non-transitory, computer-readable medium and executed by a processing unit, wherein the compression handler is configured to write, to a compression destination memory, compressed data of a target region in an image to be compressed. Furthermore, the method includes retrieving, by an overflow handler stored on a non-transitory, computer-readable, medium and executed by a processing unit, a memory address of a designated overflow memory configured to store data that results from an overflow during image compression, wherein the designated overflow memory occupies an amount of memory congruent with an amount of memory that would be necessary in the case of a maximum amount of overflow of the compression destination memory occurring during the image compression. Additionally, the method includes writing, by the overflow handler, overflow data to the designated overflow memory.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

Figure 1:
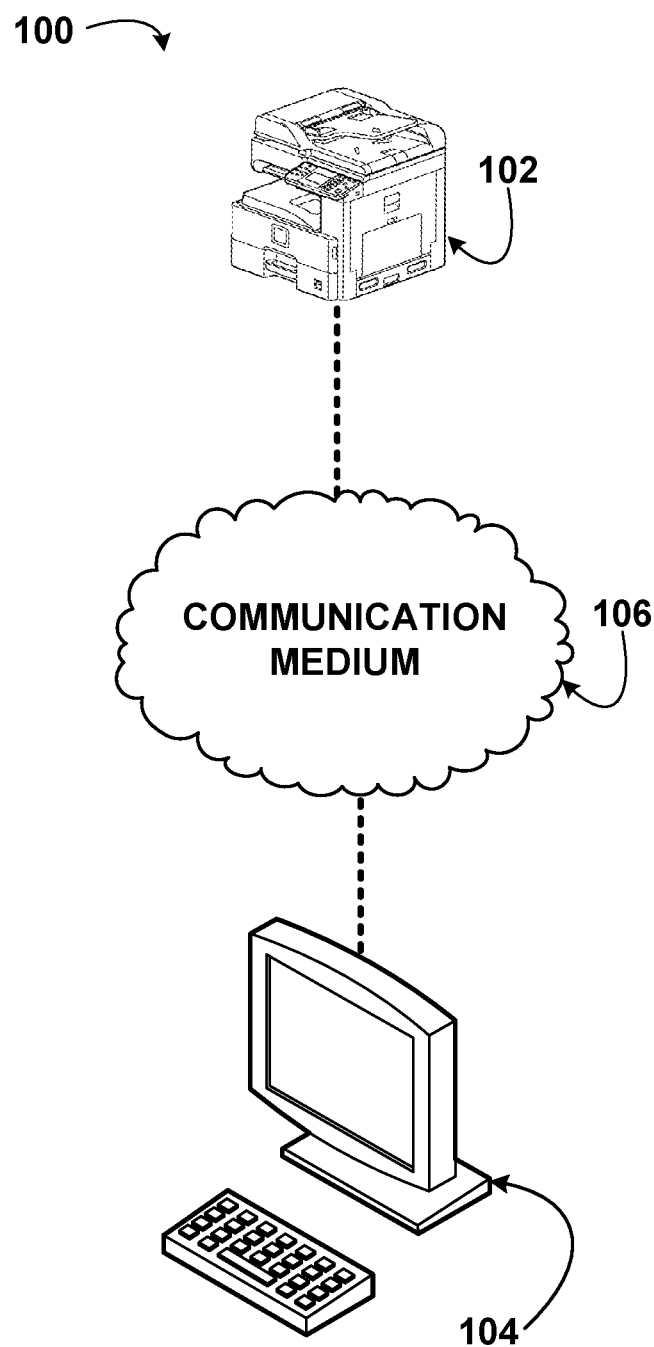
FIG. 1 is an illustration of an image forming system, according to example embodiments.

Example methods and systems are described herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the figures should not be viewed as limiting. It should be understood that other embodiments might include more or less of each element shown in a given figure. In addition, some of the illustrated elements may be combined or omitted. Similarly, an example embodiment may include elements that are not illustrated in the figures.

I. OVERVIEW

Example embodiments reduce memory used to store overflow data when an overflow occurs during image compression within a printing device or printing system.

In one embodiment, when a printing device scans an input image and prepares it for transmission, or when a printing device requires storing an input image, either from a scanning event or as the result of a transmission from a computing device, compression is required. In order to perform the image compression, a compression unit executes a compression process within the printing device or the computing device.

The compression process may begin with a compression handler reading a target region within the input image into temporary memory, in preparation for compression. The target region may be a band or an 8-by-8 square of pixels within the input image, for example. The compression handler may then begin compressing that region using a compression algorithm, such as run-length encoding, for example. In addition, the compression algorithm may break the input image up into constituent planes, referred to as compression planes. An example set of compression planes is the set comprising the fundamental components of the CMYK (cyan, magenta, yellow, and key (black)) color model, namely, a C plane, an M plane, a Y plane, and a K plane. When compressed image data is created, it may then be written to a compression destination memory.

It may be the case, such as when the input image is not well suited for the particular compression algorithm chosen, that the compression instead results in an excess of image data, i.e. more than in the uncompressed version of the input image. When this happens, an overflow may occur.

If an overflow occurs, an overflow handler may be tasked with handling the excess data produced from compression. In order to save memory, the overflow handler will write this data to a specially designed designated overflow memory.

The designated overflow memory exists so the compression destination memory need not account for overflow, i.e. by being large enough to allow for the worst case compression. In various embodiments, the designated overflow memory is located on the same chip as the compression handler and/or the overflow handler. In alternative embodiments, the designated overflow memory is located in specific regions of volatile memory within the printing system (the computing device and the printing device) that are accessible by the overflow handler. They may be directly, physically accessible, such as by bus connections on a circuit board, or virtually accessible, such as by location listed within a descriptor table.

Instead of the compression destination memory being large enough so it can hold even the worst case compression results, the designated overflow memory is sized in a smaller amount that can be repeatedly rewritten during the compression process. This leads to a savings of overall memory during compression.

II. EXAMPLE SYSTEMS

FIG. 1 is an illustration of an image forming system 100, according to example embodiments. The system 100 includes a printing device 102, a computing device 104, and a communication medium 106.

Figure 2:
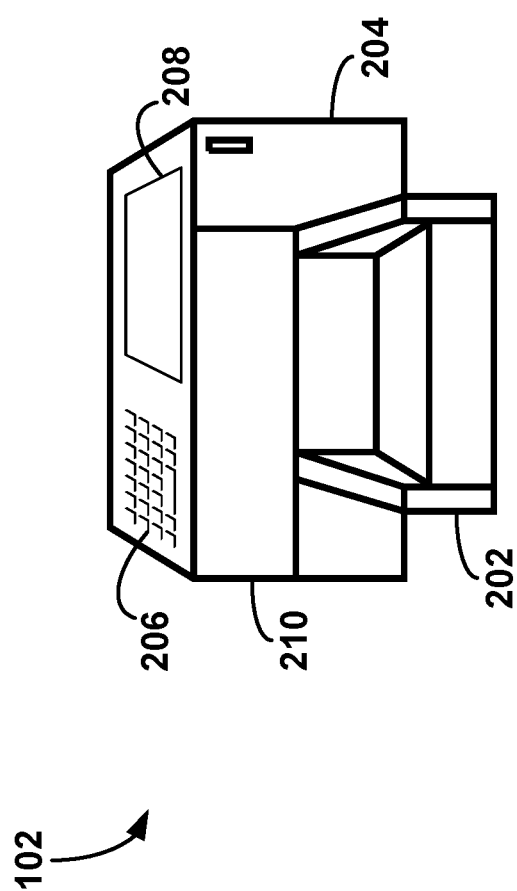
FIG. 2 depicts a printing device, according to example embodiments.
Figure 3:
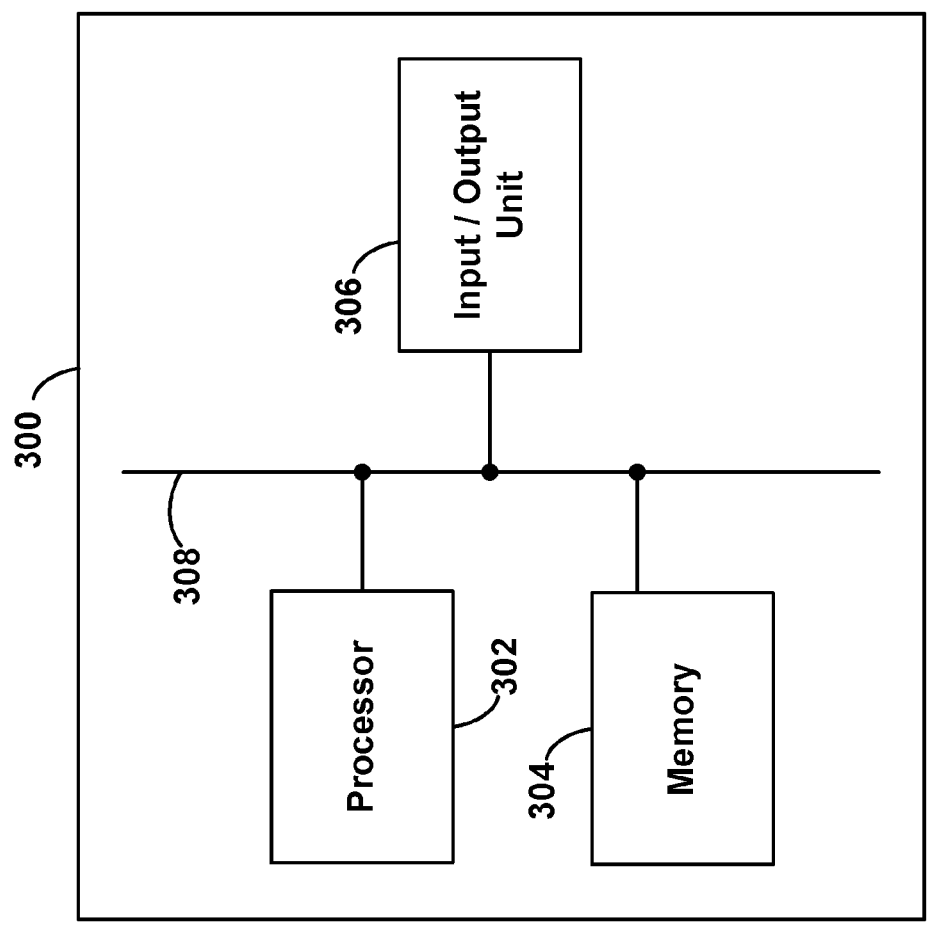
FIG. 3 is a schematic block diagram illustrating computing components of a printing device, according to example embodiments.

The printing device 102 is further detailed in FIGS. 2 and 3, and may be a printer, a scanner, a facsimile unit, or an MFP capable of performing multiple tasks.

The computing device 104 may be a desktop computing device, a laptop computing device, a tablet computing device, or a mobile computing device in various embodiments. The computing device 104 is responsible for transmitting image data to and receiving image data from the printing device 102. The computing device 104 may additionally store image data, as well as perform other tasks unrelated to image compression.

The communication medium 106 is a means through which the printing device 102 and the computing device 104 communicate image data to one another. The communication medium 106 may be a private network, such as a local area network (LAN), or a public network, such as the public Internet. Additionally, the communication medium 106 may be a direct connection between the computing device 104 and the printing device 102, in some embodiments.

The printing device 102 and the computing device 104 may communicate over the communication medium 106 using wireline or wireless communication in various embodiments. For example, the computing device 104 may have a wireless connection to a router, which serves as the communication medium 106 (acting as a hub for a LAN). The printing device 102 may have access to the same router using a wireline interface. Using the LAN as the communication medium 106, the printing device 102 and the computing device 104 may transmit information to one another.

FIG. 2 depicts an example printing device 102. The printing device 102 may be configured to print partially-stored and/or fully-stored electronic documents on various types of physical output media. These output media include, but are not limited to, various sizes and types of paper, overhead transparencies, and so on. The printing device 102 may be interchangeably referred to as a "printer."

The printing device 102 may serve as a local peripheral to a computing device 104, such as a personal computer, a server device, a print server, etc. In these cases, the printing device 102 may be attached to the computing device by cable, such as a serial port cable, parallel port cable, Universal Serial Bus (USB) cable, Firewire (IEEE 1394) cable, or High-Definition Multimedia Interface (HDMI) cable. Thus, the computing device 104 may serve as a source of electronic documents for the printing device 102.

On the other hand, the printing device 102 may include a wireline or wireless network interface, such as an Ethernet or Wi-Fi (IEEE 802.11 standards) interface. So arranged, the printing device 102 may serve as a printing device for any number of computing devices that can communicate with the printing device 102 over a network. In some embodiments, the printing device 102 may serve as both a local peripheral and a networked printer at the same time. In order to use the printing device 102, computing devices may install one or more printer drivers. These printer drivers may include software components that convert the electronic documents to be printed from various local representations stored on the computing devices to one or more representations supported by the printing device 102.

Regardless, the printing device 102 may comprise a computing device, and may carry out both printing-related and non-printing related tasks. For instance, the printing device 102 may also include copier, fax, and scanner functions. In some embodiments, the printing device 102 may use a scanning unit to facilitate copier and/or fax functions. For instance, the printing device 102 may scan a physical document into an electronic format, and then print the resulting electronic document to provide a copy, and/or transmit the resulting electronic document via a telephone interface to provide a fax operation. Additionally, the printing device 102 may be able to receive a faxed electronic document via a telephone interface, and then compress and store a representation of this electronic document.

In order to support its various capabilities, the printing device 102 may include a document feeder/output tray 202, paper storage 204, a user interface 206, a scanning element 208, and a chassis 210. It should be understood that printing devices may take on a wide variety of forms. Therefore, the printing device 102 may include more or fewer components than depicted in FIG. 2, and/or components arranged in a different fashion than depicted in FIG. 2.

The document feeder/output tray 202 may hold physical documents (e.g., a stack of one or more sheets of paper) that are to be scanned, copied, or faxed. Advantageously, the document feeder/output tray 202 may allow the printing device 102 to automatically feed multiple physical documents for processing by the printing device 102 without requiring manual intervention. The document feeder/output tray 202 may also include one or more separate output trays for holding physical documents that have been processed by the printing device 102. These may include physical documents that have been scanned, copied, or faxed by the printing device 102, as well as physical documents that have been produced by, e.g., the fax and/or copying functions of the printing device 102.

Paper storage 204 may include trays and/or feeding elements for various types of physical media. For instance, paper storage 204 may include separate trays for 8.5×11 inch paper, A4 paper, letterhead paper, envelopes, and so on. For any operation of the printing device 102 that involves outputting physical media (e.g., printing, copying, and/or receiving a fax), paper storage 204 may supply the physical media.

The user interface 206 may facilitate the interaction of the printing device 102 with a human or non-human user, such as to receive input from a user and to provide output to the user. Thus, the user interface 206 may include input components such as a keypad, keyboard, touch-sensitive or presence-sensitive panel, joystick, microphone, still camera, and/or video camera. The user interface 206 may also include one or more output components such as a display screen (which, for example, may be combined with a presence-sensitive panel), a cathode ray tube (CRT), a liquid crystal display (LCD), a light emitting diode (LED) based display, a display using digital light processing (DLP®) technology, a light bulb, and/or one or more other similar devices, now known or later developed. The user interface 206 may also be configured to be able to generate audible output(s), via a speaker, speaker jack, audio output port, audio output device, earphones, and/or other similar devices, now known or later developed in the future.

The scanning element 208 may be a glass panel below which a movable light source operates to scan physical media placed on top of the glass panel. Alternatively, a digital camera below the glass panel may "scan" the physical media placed on top of the glass panel by taking a picture of the physical media. Images of scanned physical media may be stored in data storage associated with the printing device 102.

The chassis 210 may include a physical housing that contains and/or interconnects various components of the printing device 102, such as the document feeder/output tray 202, paper storage 204, the user interface 206, and the scanning element 208. Additionally, the chassis 210 may house other components not shown in FIG. 2. For example, the chassis 210 may contain one or more toner cartridges, liquid ink jets, belts, rollers, and/or power supplies. Further, the chassis 210 may include communication interfaces, such as a wireline and/or wireless network interfaces, a telephony interface (e.g., an RJ45 jack), a USB interface, a BLUETOOTH® interface, a card reader port, etc.

Moreover, as the printing device 102 may be based on general-purpose and/or specially-designed computing device components, the chassis 210 may also house some or all of these components. To that point, FIG. 3 depicts an example embodiment 300 of computing device components (e.g., functional elements of a computing device) that may be included in the printing device 102.

Computing device components 300 may include a processor 302, memory 304, and an input/output unit 306, all of which may be coupled by a system bus 308 or a similar mechanism. The processor 302 may include one or more central processing units (CPUs), such as one or more general purpose processors and/or one or more dedicated processors (e.g., application specific integrated circuits (ASICs) or digital signal processors (DSPs), etc.).

Memory 304, in turn, may comprise volatile and/or non-volatile data storage and can be integrated in whole or in part with the processor 302. Memory 304 may store program instructions, executable by the processor 302, and data that are manipulated by these instructions to carry out the various methods, processes, or functions described herein. Alternatively, these methods, processes, or operations can be defined by hardware, firmware, and/or any combination of hardware, firmware, and software. Therefore, memory 304 may include a tangible, non-transitory, computer-readable medium, having stored thereon program instructions that, upon execution by one or more processors 302, cause the printing device 102 to carry out any of the methods, processes, or functions disclosed in this specification or the accompanying drawings.

Memory 304 may also be configured to store compressed and non-compressed electronic documents that may later be processed (e.g., printed or faxed). Thus, memory 304 may serve as an output medium for these electronic documents.

The input/output unit 306 may include any of the operations and/or elements described in reference to the user interface 206. Thus, the input/output unit 306 may serve to configure and/or control the operation of the processor 302. The input/output unit 306 may also provide output based on the operations performed by the processor 302.

These examples of a printing device 102 are provided for illustrative purposes. In addition to and/or alternatively to the examples above, other combinations and/or sub-combinations of printer and computer technologies may also exist, among other possibilities, without departing from the scope of the embodiments herein.

Figure 4:
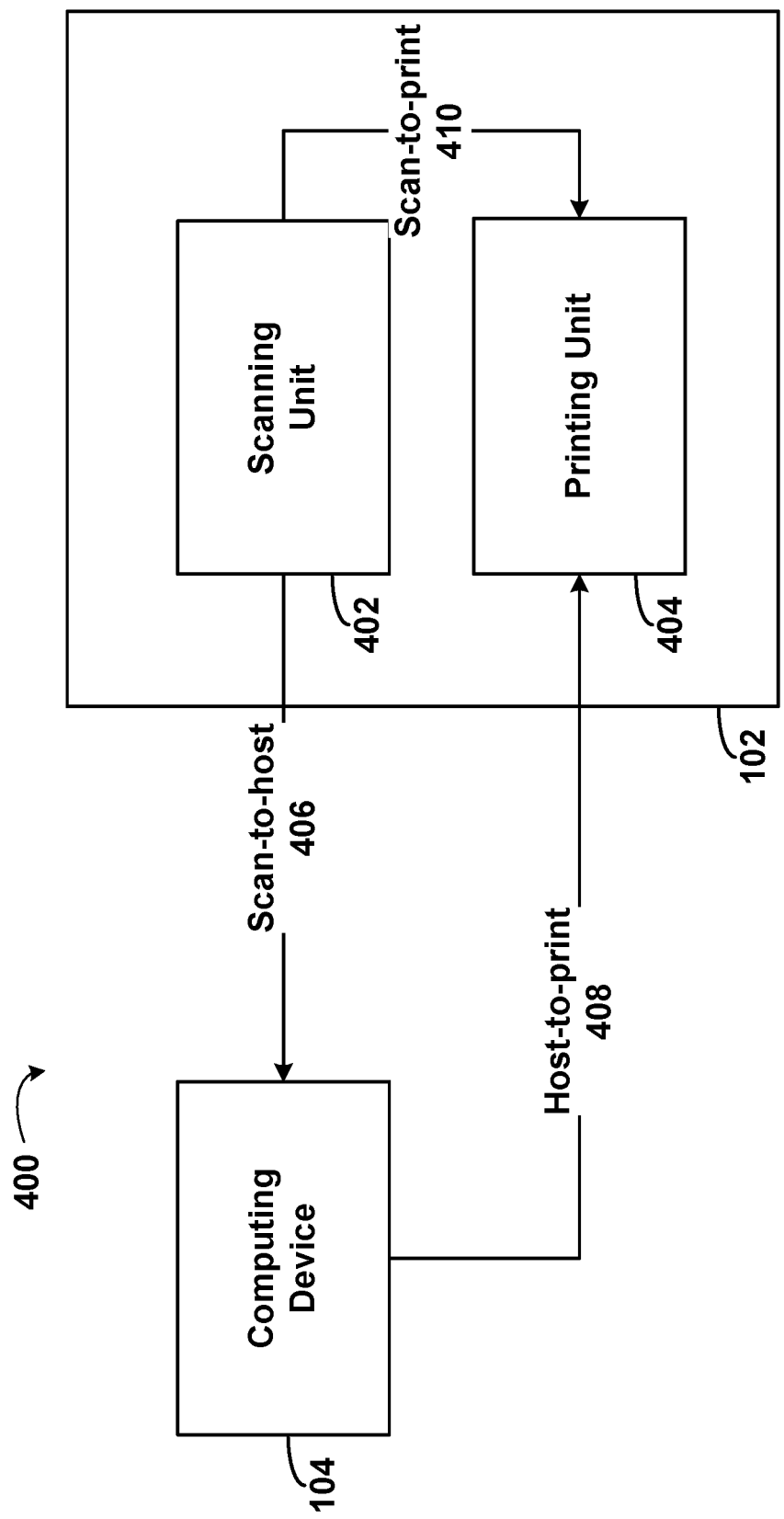
FIG. 4 is a schematic block diagram illustrating various data paths involving a printing device, according to example embodiments.

FIG. 4 depicts some of the possible data paths through which a representation of an electronic document processed by the printing device 102 may pass. In FIG. 4, it is assumed that the printing device 102 may include a scanning unit 402 and a printing unit 404. Control of each of these units may be implemented in hardware, firmware, software, or any combination of hardware, firmware, and/or software. Additionally, the scanning unit 402 and the printing unit 404 may communicate with the computing device 104, and possibly with other computing devices as well. In some situations, the data paths supported by the printing device 102 may be referred to as "pipelines."

A scan-to-print data path 410 may be supported by the scanning unit 402 and the printing unit 404. The scan-to-print data path 410 may be used, e.g., when a user instructs the printing device 102 to copy a physical document. In response to this instruction, the scanning unit 402 may scan the physical document into an electronic document, and transmit the electronic document via the scan-to-print data path 410 to the printing unit 404. Use of the scan-to-print data path 410 may involve, at least temporarily, storing some or all of the electronic document (possibly in a compressed format) in the memory 304 of the printing device 102. Then, the printing unit 404 may print the electronic document to physical media (e.g., one or more sheets of paper).

A scan-to-host data path 406 may also be supported by the scanning unit 402 and the computing device 104. The scan-to-host data path 406 may be used, e.g., when a user instructs the printing device 102 to scan a physical document. The user may also instruct the printing device 102 to transmit a representation of the resulting electronic document to the computing device 104, or the printing device 102 may be pre-configured to transmit the electronic document to the computing device 104 upon each completion of a scanning action. Thus, in response to this instruction, the scanning unit 402 may scan the physical document into an electronic document, and transmit the resulting electronic document via the scan-to-host data path 406 to the computing device 104. Use of the scan-to-print data path 410 may involve, at least temporarily, storing (possibly in a compressed format) some or all of the electronic document in the memory 304 of the printing device 102, and transmitting a representation of the resulting electronic document to the computing device 104.

A host-to-print data path 408 may be supported by the computing device 104 and the printing unit 404. The host-to-print data path 408 may be used, e.g., when the computing device 104 is instructed by a user to print an electronic document on the printing device 102. In response to this instruction, the computing device 104 may transmit a representation of the electronic document to the printing unit 404. The printing device 102, via the printing unit 404, may print the electronic document to physical media. Some, or all, of the electronic document may be stored (possibly in a compressed format) in the memory 304 of the printing device 102 before and/or during the printing of the electronic document.

Clearly, for at least one of the data paths discussed above, as well as possibly other data paths supported by the printing device 102, an electronic document may require storage and/or transmission over a network or a cable. The efficiency of both the storage and transmission of electronic documents can be improved by compressing these electronic documents for storage and/or transmission. For example, if electronic documents can, on average, be compressed to one-quarter their initial size, then about four times as many electronic documents can be stored in a fixed amount of data storage. Further, the transmission of these compressed electronic documents over a network or cable can occur about four times as fast as would transmission of the uncompressed electronic documents.

In the past, lossy compression may have been used for some data paths, while lossless compression may have been used for other data paths (lossy compression techniques compress data by discarding some of it, while lossless compression techniques compress data without discarding any of it.). For example, in some implementations, the host-to-print data path 408 may utilize lossless compression in order to preserve sharp edges of text and line art in printed versions of electronic documents. On the other hand, the scan-to-host data path 406 and the scan-to-print data path 410 may utilize lossy compression in order to efficiently store and transmit scanned physical documents containing graphical images. The printing device 102 may be made more efficient and its software and/or hardware implementation may be simplified by using the same or a similar compression technique for at least some (and perhaps all) of its data paths.

Thus, a compression technique that supports both lossless and lossy compression may be desirable. It may also be desirable for both lossless and lossy compression to be able to be applied within the same document.

III. EXAMPLE PROCESSES

Figure 5A:
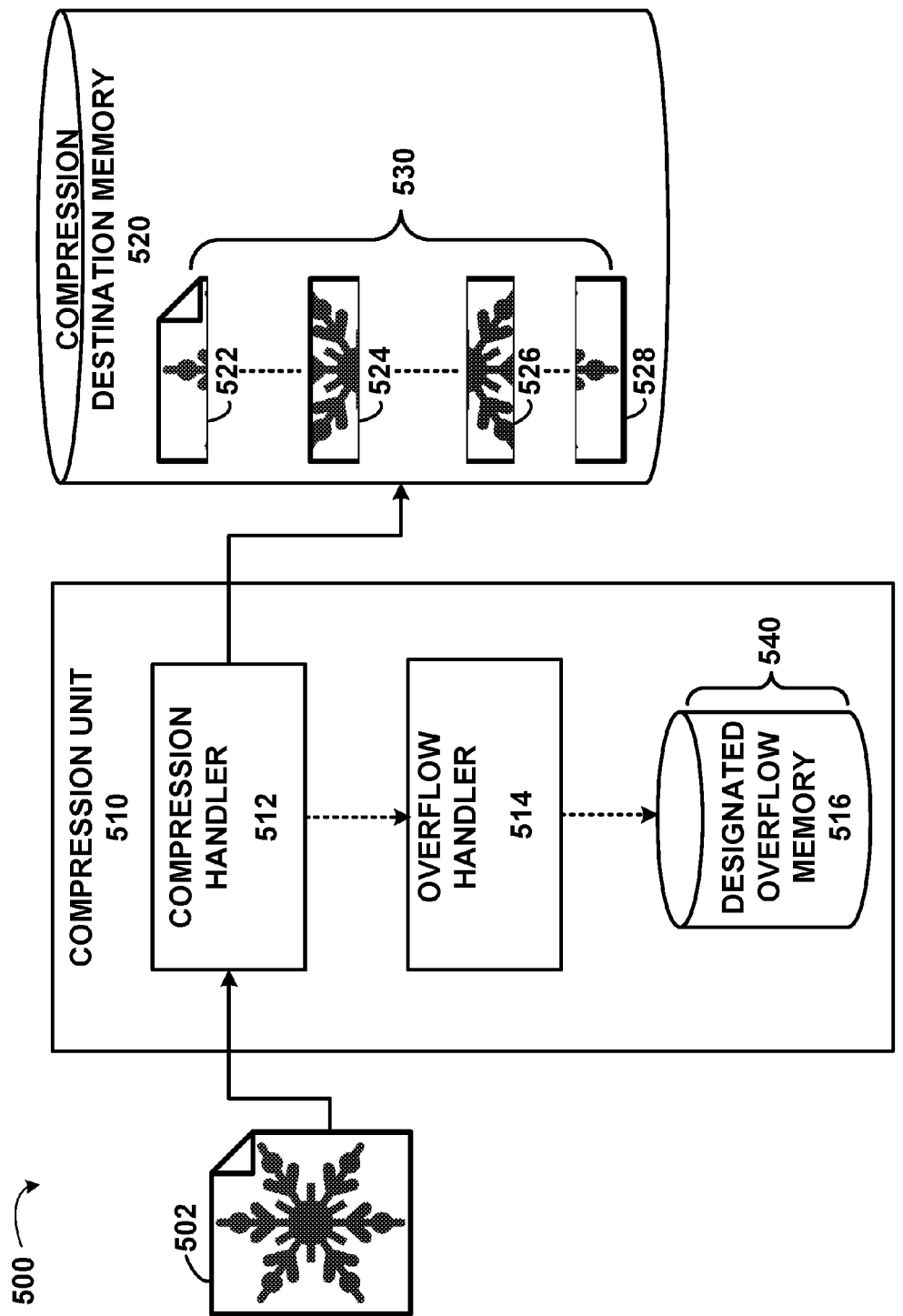
FIG. 5A is a schematic block diagram illustrating a compression process, according to example embodiments.

FIG. 5A is a schematic block diagram illustrating a compression process 500, according to example embodiments. The process 500 is carried out on an input image 502 by a compression unit 510 and a compression destination memory 520. In some embodiments, the compression process 500 illustrated will be carried out on a printing unit 102. The compression unit 510 is comprised of a compression handler 512, an overflow handler 514, and a designated overflow memory 516. The compression destination memory 520 contains the resulting compressed bands 522, 524, 526, 528 of the input image 502. FIG. 5A also depicts the proportion of the post-compression memory occupied by the compressed bands 530 and the proportion of the post-compression memory dedicated to overflow 540.

The solid arrows in FIG. 5A represent the flow of data during the compression process 500. The dotted arrows represent a possible flow of data during compression, if overflow occurs. The dotted lines represent an indirect connection between elements, through virtual address linking in a descriptor table, for instance.

The input image 502 may be an electronic document that requires compression by the printing device 102. In some embodiments, the input image 502 has been acquired during a scanning operation by the scanning element 208 and the scanning unit 402 that needs to be compressed before transmission over the communication medium 106 to the printing device 104. This may occur during a utilization of the scan-to-host data path 406.

In another instance, the input image 502 may have been scanned by the scanning element 208 and the scanning unit 402, but requires compression before being stored within the printing device 102. This may occur while utilizing the scan-to-print data path 410.

Alternately, in some embodiments, the input image 502 may be an electronic document, transmitted by the computing device 104 over the communication medium 106, that requires printing by the printing device 102/the printing unit 404. If, however, other documents are ahead of the input image 502 in a printing queue, the input image 502 may need to be temporarily stored within the memory 304 in the printing device 102. This action may occur during a utilization of the host-to-print data path 408. The input image 502, though, may require compression by the compression process 500 before being stored within the memory 304. The compression unit 510 may be implemented as a combination of hardware and software, in some embodiments. It may be implemented as an ASIC, specially designed for duties carried out by the printing device 102. In other embodiments, the compression unit 510 may be a general purpose processing unit programmed in a specific way to perform the duties of the printing device 102, and, in particular, the compression unit 510.

The compression handler 512, in some embodiments, will be a set of instructions stored on a non-transitory, computer-readable medium within the compression unit 510. For example, the compression handler 512 may be stored within the memory 304 and executed by the processor 302. These instructions will perform a compression of the input image 502.

Various compression strategies may be employed by the compression handler 512 to compress the input image 502, such as run-length encoding, entropy encoding, DEFLATE encoding, fractal compression, and chroma subsampling, to name a few examples. These may be employed as part of more complex compression algorithms, such as joint photographers expert group (JPEG) compression or portable network graphics (PNG) compression.

In some embodiments, when acting to compress the input image 502, the compression handler 512 may divide the input image 502 into smaller fractions, such as bands or squares. Furthermore, the compression handler 512 may also partition the input image 502 into various compression planes. Some delineation methods used to partition compression planes include planes divided based on the CMYK color model, planes divided based on the RGB (red, green, and blue) color model, planes divided based on the HSL (hue, saturation, and lightness) color model, and planes divided based on the YCbCr (luminance, blue-difference chroma component, and red-difference chroma component) color space.

In addition to planes based on color, the input image 502 may be digitally represented using an attribute plane. While the values of the attribute plane might not appear visibly in the image, the attribute plane may be used to provide guidance to image compression and processing operations.

As an example, each pixel in the input image 502 may be associated with an array of bits (e.g., 8 bits or 16 bits) representing attributes. Some of these attributes may indicate whether a pixel is used as an overlay on top of other materials, or being used as part of a printing or a copying feature. Other attributes may include a reference to a neutral color preservation technique, a color conversion table to use when converting the pixel between color models, and/or a reference to a halftone screen to use when printing the pixel.

In some embodiments, the compression handler 512 may partition the input image 502 using a combination of color planes and an attribute plane. For example, in a monochromatic compression scheme, the input image 502 may be divided using a "K" plane (which varies depending on the shade of gray within different regions of the input image 502) and an attribute plane.

An attribute plane may be referred to as an "A" plane. Thus, when an attribute plane augments one or more color planes, the combined attribute and color planes may be referred to as KA, CMYA, CMYKA, RGBA, HSLA, or YCbCrA, depending on color model being used.

As mentioned previously, while performing the compression, the "compressed" data may end up being larger than the corresponding region in the input image 502. When this occurs, a memory overflow may happen. If the compression handler 512 detects an overflow of memory during the compression process 500, the overflow handler 514 will be alerted.

The overflow handler 514, in some embodiments, may be a set of instructions stored on a non-transitory, computer-readable medium within the compression unit 510. For example, the overflow handler 514 may be stored within the memory 304 and executed by the processor 302. These instructions will manage memory, either within the compression unit 510 or exterior to the compression unit 510 depending on the embodiment, in response to an overflow event.

The overflow handler 514 may perform such tasks as writing the overflow data to the designated overflow memory 516. In some embodiments, it may communicate back to the compression handler 512 to indicate when this task has been completed. The overflow handler 514 may also be capable of outputting an overflow interrupt, indicating to the compression handler 512 that compression should cease.

The designated overflow memory 516, in some embodiments, comprises an overflow use buffer that utilizes on-chip memory within an ASIC (the compression unit 510). The designated overflow memory 516 may be rewritable during the execution of the compression process 500. The rewriting of the designated overflow memory 516 may occur during compression for separate bands or regions within the input image 502 or for separate compression planes within each band or region.

The designated overflow memory 516 may be allocated during the initialization of the printing device 102. When this allocation occurs, the memory location of the designated overflow memory 516 is registered within the overflow handler 514. Alternatively, the designated overflow memory 516 may be allocated during the initialization of the compression process 500.

Once the compression handler 512 successfully compresses a portion of the input image 502, the compressed output may be stored within the compression destination memory 520. The compression destination memory 520 may be contained within the printing device 102, or alternatively, within the computing device 104.

In some embodiments, the compression destination memory 520 may take the form of a synchronous dynamic random access memory (SDRAM), or a subsection of an SDRAM. Within the compression destination memory 520, the resulting compressed bands 522, 524, 526, 528 are stored.

The number of bands used to represent the input image 502 after compression will vary in various embodiments and with different input images 502. The use of four bands in FIG. 5A is as an example only, and is understood not to represent a best or preferred number of bands.

In some embodiments, the resulting compressed bands 522, 524, 526, 528 will store data for each compression plane contained within the original band within the input image 502. For example, if the compression handler 512 is utilizing the CMYK color model, compressed band 522 may contain 4 bands of data, one for each compression plane (C, M, Y, and K) in the first band of the input image 502.

The compressed bands 522, 524, 526, 528 will, in some embodiments, occupy contiguous portions of the compression destination memory 520. However, in other embodiments, the compressed bands 522, 524, 526, 528 may occupy discontinuous portions of the compression destination memory 520 and be linked by virtual addresses. Such virtual addresses may be contained within a descriptor table.

The proportion of post-compression memory occupied by the compressed bands 530 represents the amount of memory allocated within the compression destination memory 520 prior to the compression process 500 illustrated in FIG. 5A. In some embodiments, this amount of memory will be equivalent to the amount of memory that would be occupied by the input image 502 without compression.

The proportion of post-compression memory dedicated to overflow 540 represents the memory allocated prior to the compression process 500 illustrated in FIG. 5A that would be required of the designated overflow memory 516 if the estimated worst case compression occurred. In some embodiments, the compression handler 512 could have worst case "compressions" that expand, rather than compress, the size of the input image 502 by as much as 1%, 10%, or 25%, depending on the algorithm used. Whether one of these worst case compressions arises during the compression process 500 may be a function of the input image 502.

In some embodiments of the compression process 500 illustrated in FIG. 5A, the designated overflow memory 516 can be continuously overwritten; therefore, the proportion of post-compression memory dedicated to overflow 540 need not be as substantial as in other possible embodiments. This is because the same region of memory can be used for the designated overflow memory 516 for each band in the input image 502 and, in some embodiments, also for each compression plane.

To quantify the amount of memory conserved for each band by the compression process 500 of FIG. 5A, a mathematical description, an alternative solution/illustration, and an example calculation are presented.

If the designated overflow memory 516 can be rewritten throughout the compression process 500 for each compression plane, a separate buffer for each plane is not needed. Therefore, the proportion of post-compression memory dedicated to overflow 540 in FIG. 5A can be calculated using the following equation:

$$PCM_{540} = (WC-1) \times OBS \times MCP$$

where $PCM_{540}$ represents the proportion of post-compression memory dedicated to overflow 540, WC is the total worst-case compression band size (original band size plus overflow) provided for a particular compression algorithm being used (where, for instance, WC=1.25 would represent a 25% expansion of the target region in the input image 502), OBS is the original memory size of the band within the input image 502 that is being compressed, and MCP is the maximum number of compression planes allowed by the compression algorithm.

The designated overflow memory 516 is written to a portion of the hardware associated with the compression unit 510 by the overflow handler 514. Therefore, no memory space in the compression destination memory 520 is allocated as an overflow buffer. The compression destination memory 520 may be stored in SDRAM or an equivalent, hence, memory in this region of the printing device 102 or computing device 104 is preserved.

An alternative, less sophisticated, means of allocating compression memory allots enough memory for every compression band location so that each location could handle the worst case possible for every compression plane, i.e. the most possible overflow for every plane. The designated overflow memory 516 would thus increase in size, as well as be appended and distributed, respectively, to the memory allocated for each compressed band 522, 524, 526, 528.

Figure 5B:
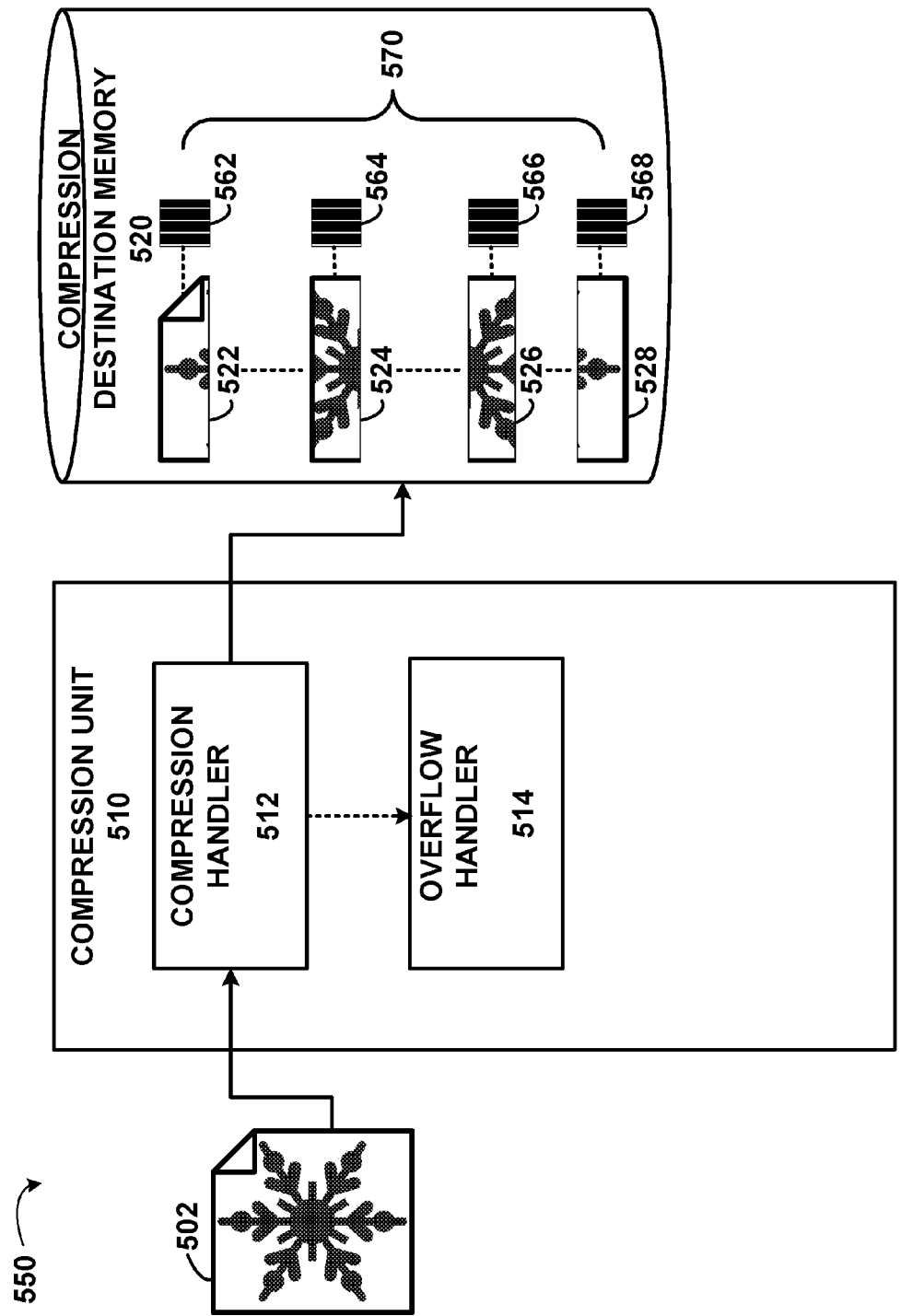
FIG. 5B is a schematic block diagram illustrating an alternative compression process.

The above described method is illustrated in FIG. 5B. The compression method 550 illustrated in FIG. 5B is similar to the compression method 500 illustrated in FIG. 5A. The primary difference is the designated overflow memory 516.

The compression band overflow memory components 562, 564, 566, 568 represent the amount of additional memory allocated to each compression band to account for the worst possible overflow occurring during compression. Together, the compression band overflow memory components 562, 564, 566, 568 are analogous to the designated overflow memory 516.

However, because they are allocated for each compression plane and for each compression band, they will occupy more memory. The total amount of memory occupied by the compressed data and overflow data 570 is indicated in FIG. 5B. This occupied memory 570 is comprised of both the proportion of the post-compression memory occupied by the compressed bands 530 and memory space that is analogous to the proportion of the post-compression memory dedicated to overflow 540 illustrated in FIG. 5A.

If the compression method 550 illustrated in FIG. 5B were used, the following equation would describe the total amount of memory allocated in SDRAM or an equivalent 570 (comprised of both the proportion of the post-compression memory occupied by the compressed bands 530 and memory that is analogous to the proportion of the post-compression memory dedicated to overflow 540 illustrated in FIG. 5A):

$$TM = WC \times OBS \times MCP$$

where TM represents the total memory that would be occupied in SDRAM or an equivalent, WC is the worst-case compression band size provided for a particular compression algorithm being used, OBS is the original memory size of the band within the input image 502, and MCP is the maximum number of compression planes allowed by the compression algorithm.

Thus, the memory conserved within the SDRAM using the compression process 500 can be normalized to the total memory allocated had the alternative compression process 550 been used:

$$MS_{norm} = \frac{PCM_{540}}{TM} = \frac{(WC-1) \times OBS \times MCP}{WC \times OBS \times MCP} = 1 - \frac{1}{WC}$$

where $MS_{norm}$ represents the normalized proportion of SDRAM saved by the compression method 500 illustrated in FIG. 5A over the compression method 550 illustrated in FIG. 5B.

As an example, if the worst case compression scenario resulted in a band that occupied 1.25 times the memory of the original band, i.e. WC=1.25, the normalized proportion of SDRAM saved by the compression method 500 illustrated in FIG. 5A over the compression method 550 illustrated in FIG. 5B would be 20% ($MS_{norm}$=0.2). If the original band were 128 pixels in height and 4992 pixels in width, and each pixel were represented by a byte, the original band size would be 638,976 bytes (OBS=128× 4992=638,976). Thus, with an SDRAM savings of 20%, the nominal amount of memory saved per compression plane would be:

$$\frac{NMS}{CP} = MS_{norm} \times OBS \times WC = .2 \times 638{,}976 \times 1.25 = 159{,}744 \text{ bytes} \approx .152 \text{ MB}$$

where $$\frac{NMS}{CP}$$

represents the nominal amount of memory saved per compression plane in the above example calculation when using the compression method 500 illustrated in FIG. 5A as opposed to the compression method 550 illustrated in FIG. 5B.

Further, there may be more than one compression plane that is compressed for the original band in the input image 502. Assuming each compression plane is allocated the same amount of base memory for the original band, i.e. OBS is the same for each compression plane, the total nominal amount of memory saved would increase linearly with each additional compression plane. If, for example, there were five compression planes used for the original band (C, M, Y, K, and an attribute plane, for instance), the total nominal amount of memory saved would be:

NMS=CP×$MS_{norm}$×OBS×WC=5×159,744=798,720 bytes 0.762 MB

Still further, there may be many bands per page, and many pages per document. For example, assuming a document containing $$55 \frac{\text{bands}}{\text{page}}$$

and 25 pages, the savings would total approximately 1.023 GB.

Figure 6:
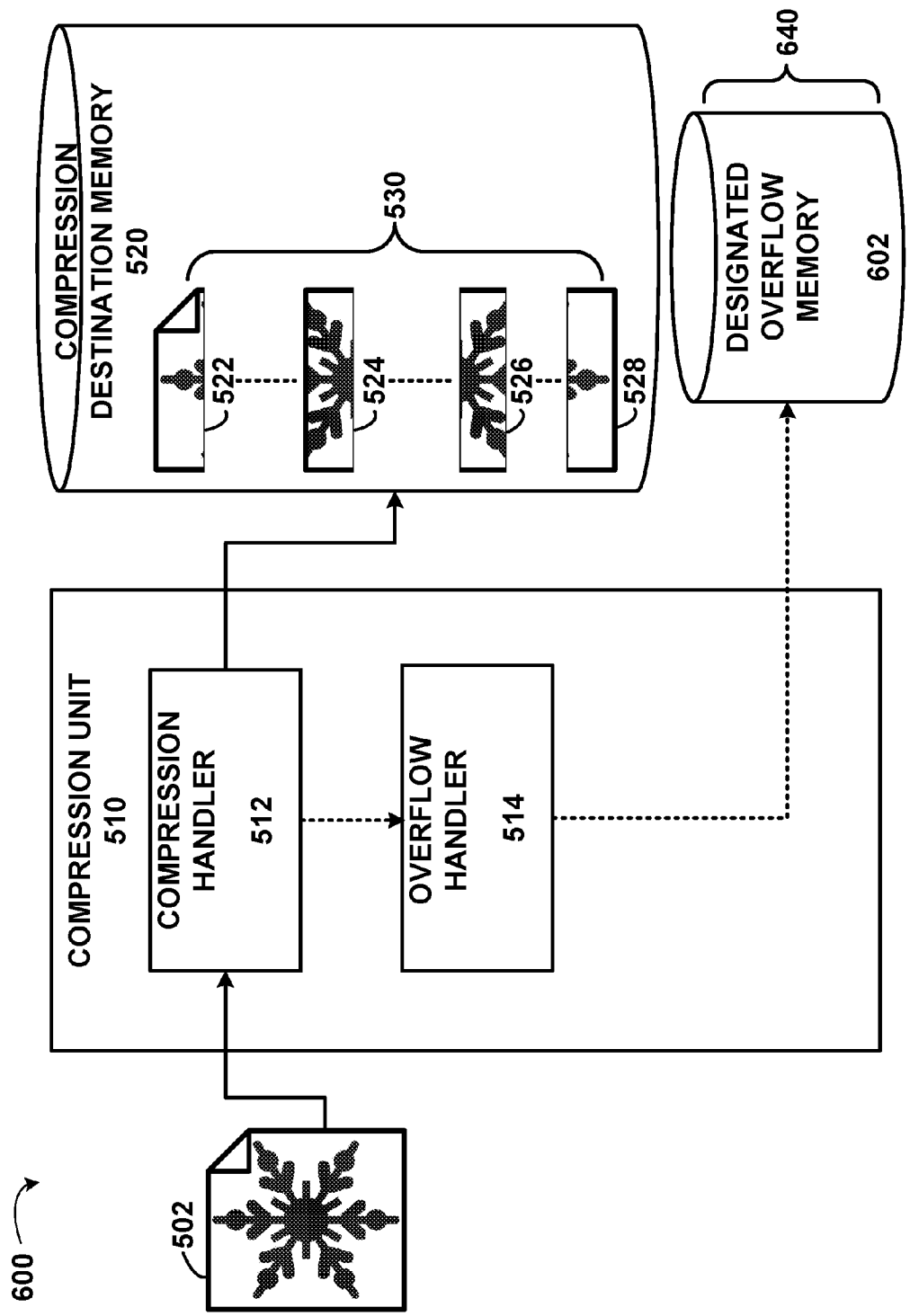
FIG. 6 is a schematic block diagram illustrating a compression process, according to example embodiments.

FIG. 6 is a schematic block diagram illustrating a compression process 600, according to example embodiments. The process 600 is carried out on an input image 502 by a compression unit 510, a compression destination memory 520, and a designated overflow memory 602. The compression unit 510 comprises a compression handler 512 and an overflow handler 514. The compression destination memory 520 contains the resulting compressed bands 522, 524, 526, 528 of the input image 502. FIG. 6 also depicts the proportion of the post-compression memory occupied by the compressed bands 530 and the proportion of the post-compression memory dedicated to overflow 640.

A detailed description of the input image 502, the compression unit 510, the compression destination memory 520, the compression handler 512, the overflow handler 514, the compressed bands 522, 524, 526, 528, and the post-compression memory occupied by the compressed band 530 is contained within the prior detailed description of FIG. 5A.

In some embodiments of the compression process 600 illustrated in FIG. 6, the designated overflow memory 602 cannot be continuously overwritten. This may be because the potential write speed to the designated overflow memory 602 is not fast enough, particularly if the designated overflow memory 602 is embodied on a form of dynamic random access memory (DRAM), to enable the use of one, rewritable block of memory for all bands and/or compression planes. If this is the case, the proportion of post-compression memory dedicated to overflow 640 may be more substantial than in other possible embodiments.

The compression process 600 illustrated in FIG. 6 is similar to the compression process 500 illustrated in FIG. 5A. A primary difference, however, is in the location of the designated overflow memory 602 and process by which it is written to by the overflow handler 514.

The designated overflow memory 602 may be allocated in SDRAM, as opposed to within the compression unit 510. The compression handler 512 may also add one register per destination compression channel for overflow (in addition to the register that holds the location of the compressed data). This additional register may hold a descriptor table address associated with each channel to be used in the compression process 600. These addresses may be registered in a new descriptor table associated with the overflow handler 514 prior to compression.

In some embodiments, when overflow occurs during the compression process 600, the overflow handler 514 may check to ensure that the registered addresses in the descriptor table exist. If the addresses do exist, the overflow handler 514 will write the overflow data to the designated overflow memory 602 throughout the duration of the compression process 600. Otherwise, the overflow handler 514 may throw an overflow error interrupt, thereby alerting the compression handler 512 that compression should cease.

Figure 7:
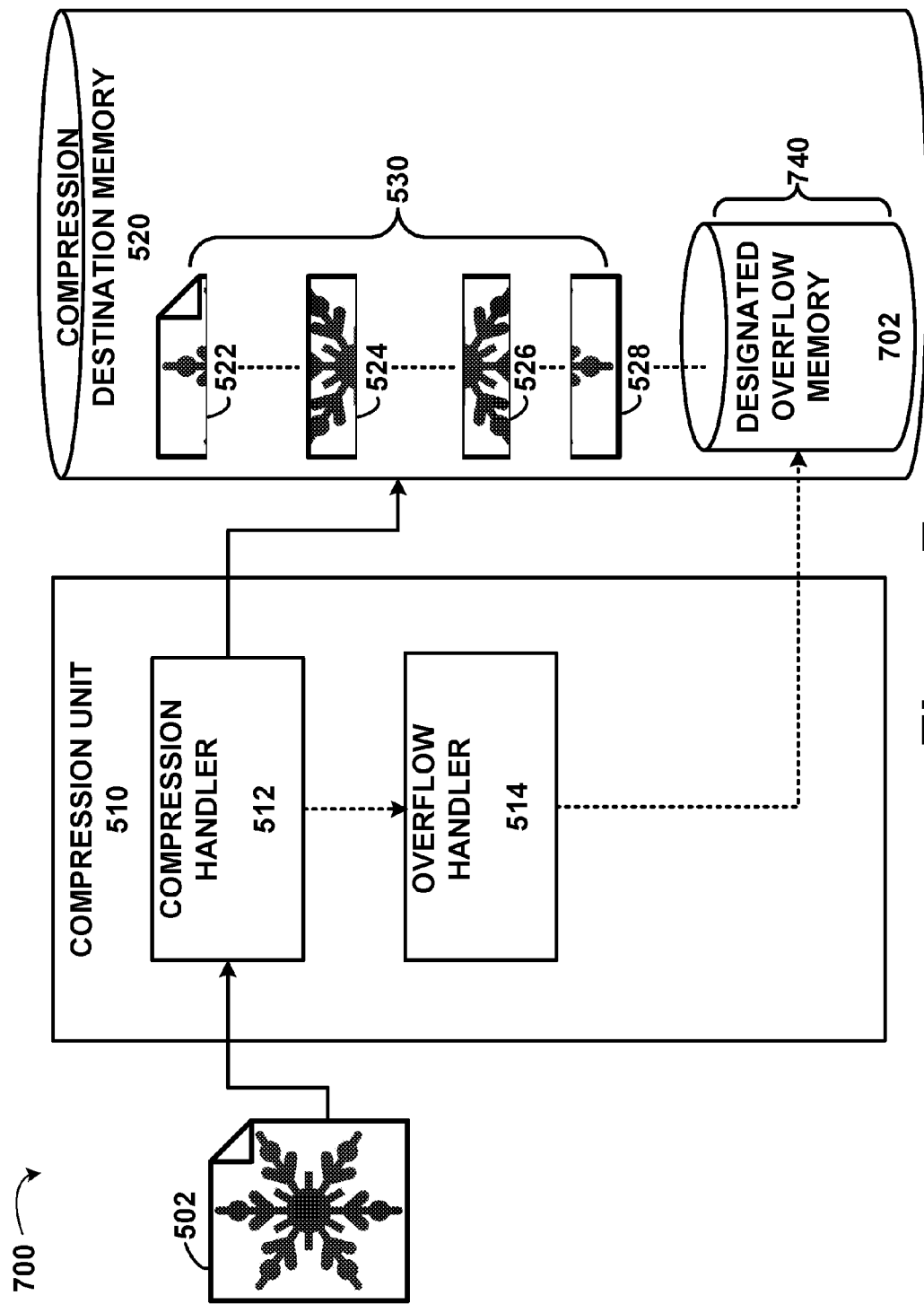
FIG. 7 is a schematic block diagram illustrating a compression process, according to example embodiments.

FIG. 7 is a schematic block diagram illustrating a compression process 700, according to example embodiments. The process 700 is carried out on an input image 502 by a compression unit 510 and a compression destination memory 520. The compression unit 510 is comprised of a compression handler 512 and an overflow handler 514. The compression destination memory 520 contains the resulting compressed bands 522, 524, 526, 528 of the input image 502 as well as a designated overflow memory 702. FIG. 7 also depicts the proportion of the post-compression memory occupied by the compressed bands 530 and the proportion of the post-compression memory dedicated to overflow 740.

A detailed description of the input image 502, the compression unit 510, the compression destination memory 520, the compression handler 512, the overflow handler 514, the compressed bands 522, 524, 526, 528, and the post-compression memory occupied by the compressed band 530 is contained within the prior detailed description of FIG. 5A.

In some embodiments of the compression process 700 illustrated in FIG. 7, the designated overflow memory 702 cannot be continuously overwritten. This may be because the potential write speed to the designated overflow memory 702 is not fast enough, particularly if the designated overflow memory 702 utilizes descriptor tables to maintain memory locations. If this is the case, the proportion of post-compression memory dedicated to overflow 740 may be more substantial than in other possible embodiments.

The compression process 700 illustrated in FIG. 7 is similar to the compression process 600 illustrated in FIG. 6. A difference, however, is in the location of the designated overflow memory 702 and process by which it is written to by the overflow handler 514.

Before the compression process 700 begins, the compression handler 512 may allocate the designated overflow memory 702 within SDRAM to allow for each channel to be used during the compression process, similar to the way in which the designated overflow memory 602 of FIG. 6 was allocated before that process began. In contrast, though, rather than registering those addresses within a new descriptor table, they are instead appended to a preexisting list or table that contains the virtual SDRAM memory locations of the compressed band 522, 524, 526, 528 locations. In some embodiments, this is done by mapping the designated overflow memory 702 to the end of the compression destination memory 520 using the descriptor table that lists the memory locations allocated for the compressed bands 522, 524, 526, 528. The descriptor table is then registered with the compression handler 512.

Upon completion of the compression process 700 of a specific band, the designated overflow memory 702 may then be unmapped from the associated descriptor table. In some embodiments, the designated overflow memory 702 may remain allocated in preparation for use of the compression process 700 to compress another band within the input image 502.

In some embodiments, the compression process 500 illustrated in FIG. 5A may be viewed as superior to the processes illustrated in FIGS. 6 and 7. This may be in terms of compression speed, as on-chip memory access for ASICs can be considerably (hundreds of times) faster than memory access of DRAM, especially if utilizing descriptor tables to maintain memory locations within the DRAM. Furthermore, the compression process 700 illustrated in FIG. 7 may be slower if the designated overflow memory 702 requires virtual mapping in software, or if the software has to create an additional descriptor table for the overflow, rather than using a preexisting descriptor table within the compression unit 510.

In addition, the compression process 500 illustrated in FIG. 5A may be viewed as superior in terms of memory conserved. Because the on-chip memory access for ASICs can be faster, the memory can be rewritten more frequently, which allows for the amount of memory allocated in case of overflow to be less.

Alternatively, however, the processes of FIGS. 6 and 7 may be more feasible, in some embodiments, than the compression process 500 illustrated in FIG. 5A. For example, a given ASIC within a printing device 102 may not have enough on-board memory to support a designated overflow memory 516 (overflow buffer), whereas DRAMs tend to have more memory space and thus, can more readily support a designated overflow memory 516.

Figure 8:
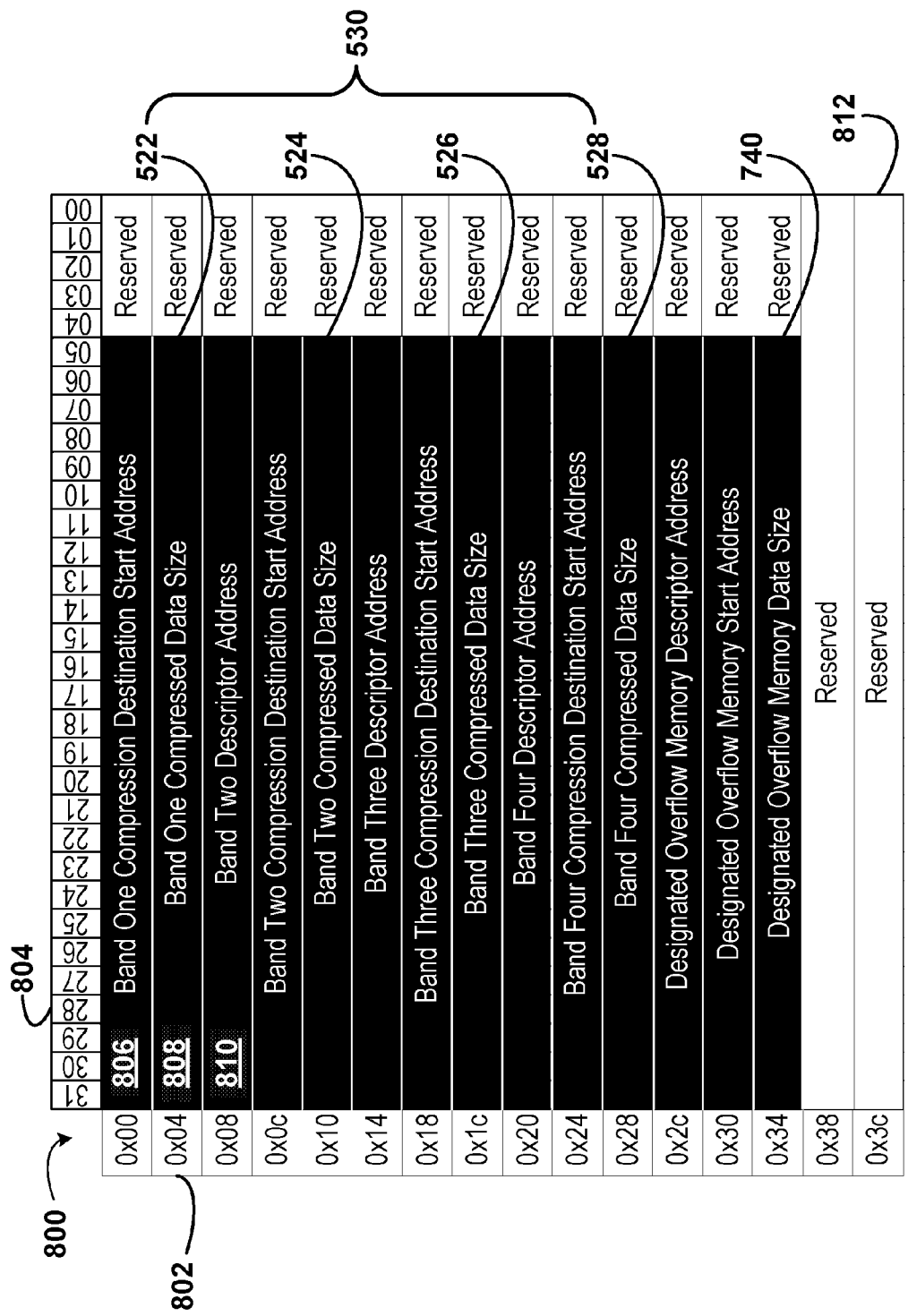
FIG. 8 is an illustration of a descriptor table, according to example embodiments.

FIG. 8 is an illustration of a descriptor table 800 which contains data stored within the compression destination memory 520, according to example embodiments. In some embodiments, the descriptor table 800 may be populated prior to the execution of the compression processes 500, 600, 700. Note that FIG. 8 depicts the descriptor table 800 as it would appear when using the compression process 700 and the designated overflow memory 702 illustrated in FIG. 7.

FIG. 8 depicts multiple 4-byte information sequences 802, multiple bit locations 804 within each 4-byte information sequence 802, multiple instances of a location start address 806, followed by a data size 808, followed by a descriptor address 810 that indicates the descriptor location containing the next location start address 806. FIG. 8 also depicts unused or reserved memory 812, as well as the size of the compressed bands 522, 524, 526, 528 of the input image 502 that are stored within the compression destination memory 520, in addition to the proportion of the post-compression memory occupied by the compressed bands 530 and the proportion of the post-compression memory dedicated to overflow 740.

The 4-byte information sequences 802 each contain some amount of information. The location start addresses 806 indicated by the 4-byte information sequences 802 may be located in SDRAM, for example, whereas the descriptor addresses 810 may be located in on-board ASIC memory. In some embodiments, the information sequences 802 may instead occupy more or less memory than 4-bytes each. The information sequences 802 are denoted in FIG. 8 by their hexadecimal representation.

Within each 4-byte information sequence 802, there are individual bits of data 804 (32 of them per 4-byte information sequence 802). These bits 804 are numbered from the most significant bit (MSB) of "31" to the least significant bit (LSB) of "00". Each one of the individual bits 804 may be either a "1" or a "0" representing one of the "binary digits" that composes each 4-byte information sequence 802.

The instances of the location start addresses 806 contain the first memory address at which the respective compressed band 522, 524, 526, 528 or the designated overflow memory 702 should be written. This indicates to the compression handler 512 or the overflow handler 514 where, within the SDRAM, the respective handler should begin writing data or, if necessary, reading data.

The instances of the data sizes 808 indicate to the compression handler 512 or to the overflow handler 514 how much memory has been allocated within the SDRAM to be written to. This may, in some embodiments, indicate to the overflow handler 514 when an overflow interrupt should be thrown (if more overflow occurs than was allocated).

Additionally, the combination of the location start addresses 806 and the data sizes 808 indicate to the compression handler 512 and the overflow handler 514 what the last occupied memory address is for each band of data. Thus, if the compression handler 512 or the overflow handler 514 requires a reading of a single band from the SDRAM, it can be known exactly where the band begins and where it ends.

The descriptor address 810 indicates where, within the descriptor table 800, the next location start address 806 can be found. This allows the compression handler 512 to find the next location in SDRAM that should be written to after the conclusion of transcribing a previously compressed band.

This schema of location start address 806, followed directly by a data size 808, followed directly by a descriptor address 810, allows for discontinuous memory locations within SDRAM to be utilized in the compression processes 500, 600, 700 because of the descriptor table 800. In some embodiments, all compressed band 522, 524, 526, 528 location start addresses 806 and data sizes 808 may be in consecutive descriptor locations, thereby obviating the need for descriptor addresses 810.

Figure 9:
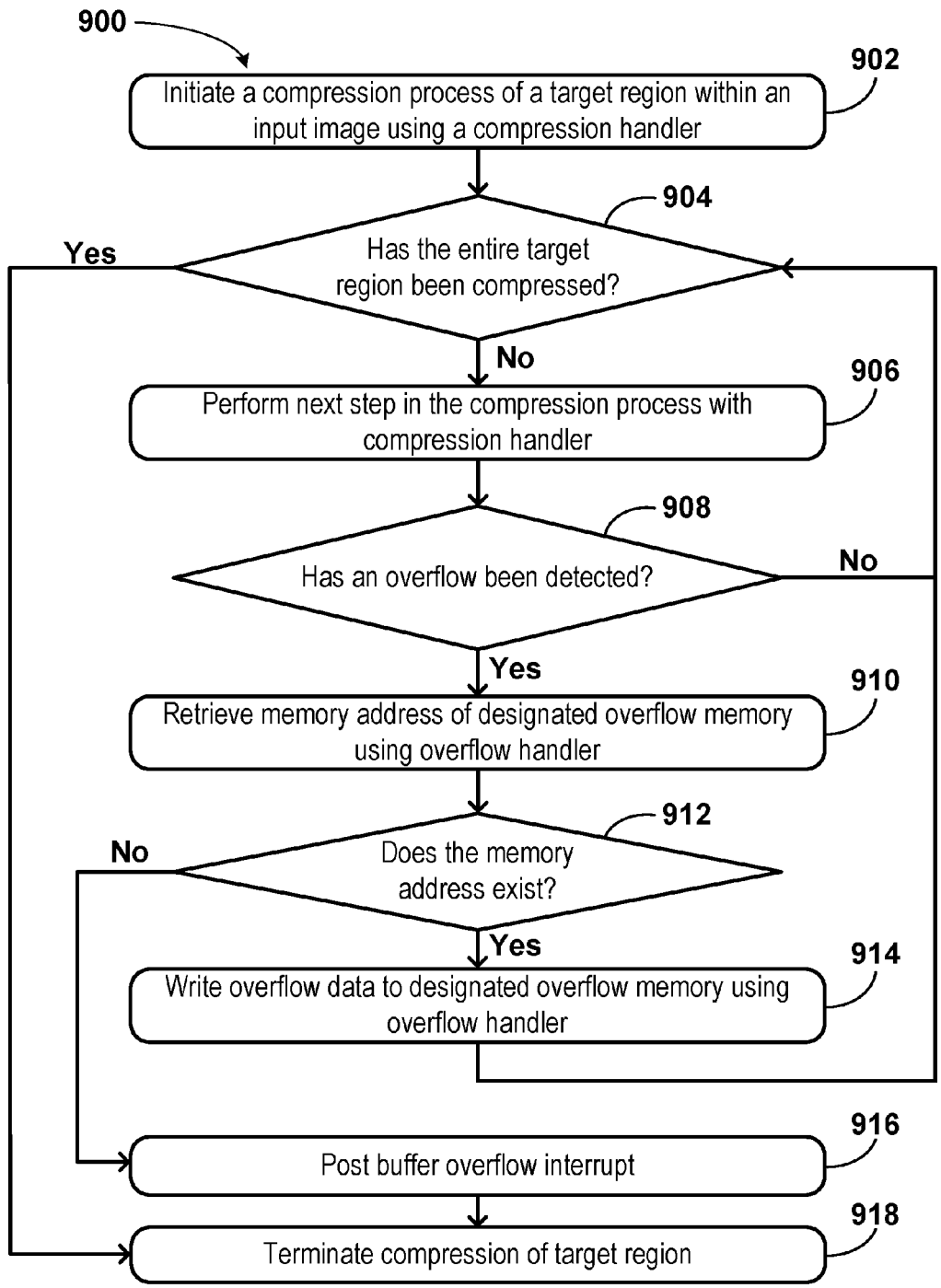
FIG. 9 is a flow diagram illustrating a compression method, according to example embodiments.

FIG. 9 is a flow diagram illustrating a compression method 900, according to example embodiments.

At step 902, the method 900 includes initiating a compression process 500, 600, 700 of a target region within an input image 502 using a compression handler 512. This may involve a processing unit 302 within a printing device 102 reading the compression handler 512 from a non-transitory, computer readable medium and then executing the compression handler 512.

The target region within the input image 502 may be, for example, a band or an 8×8 square of pixels. In some embodiments, the target region within the input image 502 may be written into a portion of memory within the printing device 102 (a pre-compression buffer), allowing it to be readily accessed during the compression process 500, 600, 700.

Prior to analyzing the target region, step 902 may include performing a file open action on the target image 502, thereby allowing the entire input image 502 to be accessible during consecutive compressions of multiple target regions within the input image 502.

In addition, step 902 may include the compression handler 512 recording the amount of memory originally occupied by the target region in the target image 502. This would allow the compression handler 512 to refer back later to the original amount of memory to compare it to a compressed amount of memory, thereby identifying if overflow had occurred.

At step 904, the method 900 includes determining if the entire target region has been compressed. In some embodiments, this includes checking to see if the last memory address previously written to the pre-compression buffer during step 902 has been read from/analyzed. If the last memory address has been read from, the compression handler 512 will ascertain that the entire target region has been compressed, otherwise, it will ascertain that the entire target region has not been compressed.

If the entire target region has been compressed, the method 900 will proceed to step 918, otherwise the method 900 will proceed to step 906.

At step 906, the method 900 includes performing the next step in the compression process 500, 600, 700 with the compression handler 512. Step 906 may vary significantly amongst embodiments, depending on the compression algorithms being used.

As an example, if run-length encoding is being used to compress the target region, step 906 may include reading, by the compression handler 512, the next sequence of image data and establishing how many consecutive sections within the target region are the same. Then, in this example, the compression handler 512 may compress this information into the length of a few bits.

As an alternate example, if chroma subsampling is the encoding method being employed by the compression handler 512, step 906 may include analyzing the color and luminescence composition of the next section of the target region. Upon analyzing these variables, the compression handler 512 may encode the corresponding, compressed section of the target region using less information.

In some embodiments, step 906 will include the compression handler 512 recording the compressed data to a compression destination memory 520.

At step 908, the method 900 includes determining if an overflow has been detected. As previously discussed, this may involve the compression handler 512 measuring the amount of memory occupied by the compressed data and comparing it to the initial amount of memory occupied by the uncompressed data.

If the compression handler 512 determines that overflow has occurred, the method 900 will proceed to step 910, and control of the method will pass from the compression handler 512 to the overflow handler 514. Otherwise, the method 900 will return to step 904, and control will be maintained by the compression handler 512.

At step 910, the method 900 includes retrieving a memory address of a designated overflow memory 516, 602, 702 using an overflow handler 514. Depending on the embodied compression process 500, 600, 700, the designated overflow memory 516, 602, 702 may be in various locations.

In some embodiments, the designated overflow memory 516 will be located on the same chip, such as an ASIC, as the overflow handler 514, thereby readily accessible by the overflow handler 514. In such embodiments, the memory address may be a physical address.

Alternatively, step 910 may involve the overflow handler 514 reading the memory address from a descriptor table, as in compression processes 600, 700. This may be a virtual address linked to the descriptor table.

At step 912, the method 900 includes determining whether the memory address of the designated overflow memory 516, 602, 702 exists. In some embodiments, such as when the designated overflow memory 516 is that of FIG. 5A, the check may be unnecessary, i.e. the answer is always yes.

However, when the address is a virtual address contained within a descriptor table, the overflow handler 514 may assure that the virtual address can be converted to a physical address available for writing. In cases where the virtual address does not link to an available physical address, the memory address will be found nonexistent.

If the memory address exists, the method 900 will proceed to step 914. Conversely, if the memory address does not exist, the method 900 will proceed to step 916.

At step 914, the method 900 includes writing overflow data to the designated overflow memory 516, 602, 702 using the overflow handler 514. Step 914 may include the overflow handler 514 writing any additional image data provided to it by the compression handler 512 to the designated overflow memory 516, 602, 702.

In many embodiments, the designated overflow memory 516, 602, 702 will have been sized appropriately so as to accommodate the worst case of compression, thereby preventing the potential for an additional overflow of the designated overflow memory 516, 602, 702. However, if the amount of overflow data to be written to the designated overflow memory 516, 602, 702 exceeds the proportion of the post-compression memory dedicated to overflow 540, 640, 740, the overflow handler 514 may proceed method 900 from step 914 to step 916 (not indicated in FIG. 9).

The data written to the designated overflow memory 516, 602, 702 may be considered useless. In some embodiments, if overflow occurs, the original image data in the target region of the input image 502 will be used instead. In embodiments where the overflow data written in step 914 is useless, it may be flushed from the designated overflow memory 516, 602, 702 using a cache-flush. Such a flushing may occur, in some embodiments, before progressing to the next target region within the input image 502.

After writing the overflow data to the designated overflow memory 516, 602, 702, by the overflow handler 514, method 900 will return to step 904. In returning to step 904, control of the compression process 500, 600, 700 will pass from the overflow handler 514 back to the compression handler 512.

At step 916, the method 900 includes posting a buffer overflow interrupt. This buffer overflow interrupt may be posted by the overflow handler 514.

The buffer overflow interrupt is a notice that alerts other components of the compression process 500, 600, 700, such as the compression handler 512, that although compression or writing of the designated overflow memory may terminate, it is not terminating as a result of successful completion. Such an alert may allow any software components to appropriately respond to the failed compression, e.g., notifying a user, reinitiating compression using a different algorithm, or deleting the associated compressed data file.

At step 918, the method 900 includes terminating the compression of the target region within the input image 502. This may be accomplished by the compression handler 512.

Step 918 may further include a check by the compression handler 512 to see if the target region upon which compression has been completed was the last region within the input image 502 to be compressed. If the target region were the last region within the input image 502 to be compressed, the compression handler 512 may perform additional tasks within step 918. Such additional tasks may include closing the input image file 502, transmitting a compressed file corresponding to the input image 502 to a computing device 104, or providing a notification on a user interface 206 indicating that compression had been successfully completed.

Additionally, upon completion of step 918, if the compression handler 512 identifies more regions requiring compression, the compression handler 512 may initiate another instance of method 900. This instance of method 900 may identify a new target region within the input image 502 during step 902.

IV. CONCLUSION

The above detailed description describes various features and functions of the disclosed systems, devices, and methods with reference to the accompanying figures. While various aspects and embodiments have been disclosed herein, other aspects and embodiments will be apparent. The various aspects and embodiments disclosed herein are for purposes of illustration only and are not intended to be limiting, with the true scope being indicated by the following claims.

What is claimed:

1. An image forming system configured to conserve memory during image compression when an overflow occurs, comprising:
   a compression destination memory configured to store image data that results from image compression, wherein the compression destination memory occupies an amount of memory congruent with an amount of memory originally contained within a target region in an image to be compressed;
   a designated overflow memory configured to store data that results from an overflow during image compression, wherein the designated overflow memory occupies an amount of memory congruent with an amount of memory that would be necessary in the case of a maximum amount of overflow of the compression destination memory occurring during the image compression;
   a compression handler, wherein the compression handler is a set of instructions that is executable by a processing unit and stored on a non-transitory, computer readable medium, configured to write, to the compression destination memory, compressed data of the target region in the image to be compressed; and
   an overflow handler, wherein the overflow handler is a set of instructions that is executable by a processing unit when overflow occurs during compression, wherein the overflow handler is stored on a non-transitory, computer readable medium, and further wherein the overflow handler is configured to write overflow data to the designated overflow memory.

2. The system of claim 1, wherein the designated overflow memory can be overwritten during the course of the image compression.

3. The system of claim 1, wherein the maximum amount of overflow is calculated by considering a maximum number of compression planes within the image to be compressed, a maximally inefficient compression for the target region, and the amount of memory occupied by the target region before compression.

4. The system of claim 3, wherein the compression planes are selected from the group of planes consisting of a C plane, an M plane, a Y plane, a K plane (from the CMYK color model), and an attribute plane.

5. The system of claim 3, wherein the compression planes are selected from the group of planes consisting of a Y plane, a Cb plane, and a Cr plane (from the YCbCr color space).

6. The system of claim 1, wherein the overflow handler is configured to check for a memory address of the designated overflow memory when overflow occurs during compression, write overflow data to the memory address if the memory address is found, and post an overflow error if the memory address of the designated overflow memory is not found.

7. The system of claim 1, wherein the designated overflow memory is allocated to an application specific integrated circuit (ASIC).

8. The system of claim 1, wherein the designated overflow memory is allocated to a random access memory (RAM).

9. The system of claim 8, wherein the designated overflow memory is appended to the compression destination memory by linking the designated overflow memory to the end of a destination descriptor table representing the compression destination memory.

10. A method for conserving memory when an overflow occurs during image compression, comprising:
    allocating, by a printing device, a compression destination memory configured to store image data that results from the image compression and occupies an amount of memory congruent with an amount of memory contained within a target region in an image to be compressed;
    allocating, by the printing device, a designated overflow memory configured to store data that results from an overflow during image compression, wherein the designated overflow memory occupies an amount of memory congruent with an amount of memory that would be necessary in the case of a maximum amount of overflow of the compression destination memory occurring during the image compression; and
    registering, by the printing device, the memory location of the compression destination memory with a compression handler and the memory location of the designated overflow memory with an overflow handler, wherein the compression handler and the overflow handler are sets of instructions that are configured to be executed by a processing unit and are stored on a non-transitory, computer-readable medium, wherein the compression handler is configured to write, to the compression destination memory, compressed data of the target region in the image to be compressed and the overflow handler is configured to write overflow data to the designated overflow memory.

11. The method of claim 10, wherein the designated overflow memory can be overwritten during the course of the image compression.

12. The method of claim 10, wherein the maximum amount of overflow is calculated by considering a maximum number of compression planes within the image to be compressed, a maximally inefficient compression for the target region, and the amount of memory occupied by the target region before compression.

13. The method of claim 12, wherein the compression planes are selected from the group of planes consisting of a C plane, an M plane, a Y plane, a K plane (from the CMYK color model), and an attribute plane.

14. The method of claim 12, wherein the compression planes are selected from the group of planes consisting of a Y plane, a Cb plane, and a Cr plane (from the YCbCr color space).

15. The method of claim 10, wherein the overflow handler is configured to check for a memory address of the designated overflow memory when overflow occurs during compression, write overflow data to the memory address if the memory address is found, and post an overflow error if the memory address is not found.

16. The method of claim 10, wherein the compression handler is configured to perform compression using compression schemes selected from a group consisting of run-length encoding, entropy encoding, DEFLATE encoding, fractal compression, and chroma sub sampling.

17. The method of claim 10, wherein the designated overflow memory is allocated to an application specific integrated circuit (ASIC).

18. The method of claim 10, wherein the designated overflow memory is allocated to a random access memory (RAM).

19. The method of claim 10, wherein the designated overflow memory is appended to the compression destination memory by linking the designated overflow memory to the end of a destination descriptor table representing the compression destination memory.

20. A method that conserves memory when an overflow occurs, comprising:
  sensing an overflow has occurred during compression, by a compression handler of a printing device stored on a non-transitory, computer-readable medium and executed by a processing unit, wherein the compression handler is configured to write, to a compression destination memory, compressed data of a target region in an image to be compressed;
  retrieving, by an overflow handler of the printing device stored on a non-transitory, computer-readable medium and executed by a processing unit, a memory address of a designated overflow memory configured to store data that results from an overflow during image compression, wherein the designated overflow memory occupies an amount of memory congruent with an amount of memory that would be necessary in the case of a maximum amount of overflow of the compression destination memory occurring during the image compression; and
  writing, by the overflow handler of the printing device, overflow data to the designated overflow memory.

* * * * *